(12) United States Patent
Fuergut et al.

(10) Patent No.: US 7,391,103 B2
(45) Date of Patent: Jun. 24, 2008

(54) ELECTRONIC MODULE HAVING PLUG CONTACTS AND METHOD FOR PRODUCING IT

(75) Inventors: Edward Fuergut, Dasing (DE); Bernd Goller, Otterfing (DE); Robert-Christian Hagen, Sarching (DE); Simon Jerebic, Regensburg (DE); Jens Pohl, Bernhardswald (DE); Holger Woerner, Regensburg (DE); Peter Strobel, Regensburg (DE)

(73) Assignee: Infineon Technologies AG, Munich (DE)

( * ) Notice: Subject to any disclaimer, the term of this patent is extended or adjusted under 35 U.S.C. 154(b) by 19 days.

(21) Appl. No.: 10/928,458

(22) Filed: Aug. 27, 2004

(65) Prior Publication Data

US 2005/0087851 A1    Apr. 28, 2005

(30) Foreign Application Priority Data

Aug. 28, 2003    (DE)    ............... 103 40 129

(51) Int. Cl.
*H01L 23/02*    (2006.01)

(52) U.S. Cl. ............... 257/678; 257/737; 257/E23.181

(58) Field of Classification Search ............... 257/678, 257/679, 789, E23.046, E23.181, E23.189, 257/E23.194, 666, 686, 737, 738; 361/679, 361/737

See application file for complete search history.

(56) References Cited

U.S. PATENT DOCUMENTS

| | | | |
|---|---|---|---|
| 4,719,140 A * | 1/1988 | Hara et al. | 428/138 |
| 4,725,924 A * | 2/1988 | Juan | 361/751 |
| 4,843,225 A * | 6/1989 | Hoppe | 235/492 |
| 4,852,911 A * | 8/1989 | Hoppe | 283/82 |
| 4,907,061 A * | 3/1990 | Kohara | 257/679 |
| 4,910,582 A * | 3/1990 | Miyamoto et al. | 257/667 |
| 4,966,857 A * | 10/1990 | Haghiri-Tehrani et al. | 156/293 |
| 5,013,900 A * | 5/1991 | Hoppe | 235/492 |
| 5,032,894 A * | 7/1991 | Marchisi | 257/679 |
| 5,244,840 A * | 9/1993 | Kodai et al. | 29/841 |
| 5,272,374 A * | 12/1993 | Kodai et al. | 257/679 |
| 5,594,204 A | 1/1997 | Taylor et al. | |
| 5,753,901 A * | 5/1998 | Bitschnau et al. | 235/492 |
| 5,822,190 A * | 10/1998 | Iwasaki | 361/737 |
| 5,850,690 A * | 12/1998 | Launay et al. | 29/841 |
| 6,209,790 B1 | 4/2001 | Houdeau et al. | |
| 6,226,189 B1 * | 5/2001 | Haffenden et al. | 361/814 |
| 6,319,827 B1 | 11/2001 | Kowalski et al. | |
| 6,404,643 B1 * | 6/2002 | Chung | 361/737 |
| 6,818,168 B2 * | 11/2004 | Morales | 264/320 |
| 6,900,527 B1 * | 5/2005 | Miks et al. | 257/679 |
| 6,903,458 B1 * | 6/2005 | Nathan | 257/737 |
| 6,911,718 B1 * | 6/2005 | Alegre et al. | 257/666 |

FOREIGN PATENT DOCUMENTS

WO    WO 99/43962    9/1999

* cited by examiner

*Primary Examiner*—Howard Weiss
*Assistant Examiner*—Hoa B Trinh
(74) *Attorney, Agent, or Firm*—Dicke, Billig, Czaja PLLC

(57) ABSTRACT

The invention relates to an electronic module having plug contacts, which has a semiconductor chip embedded in a plastics composition with its rear side and its edge sides. An active top side of the semiconductor chip forms, together with the plastics composition, an overall top side, there being arranged on the latter a rewiring layer with plug contact areas and rewiring lines that connect the plug contact areas to contact areas of the top side of the semiconductor chip.

21 Claims, 3 Drawing Sheets

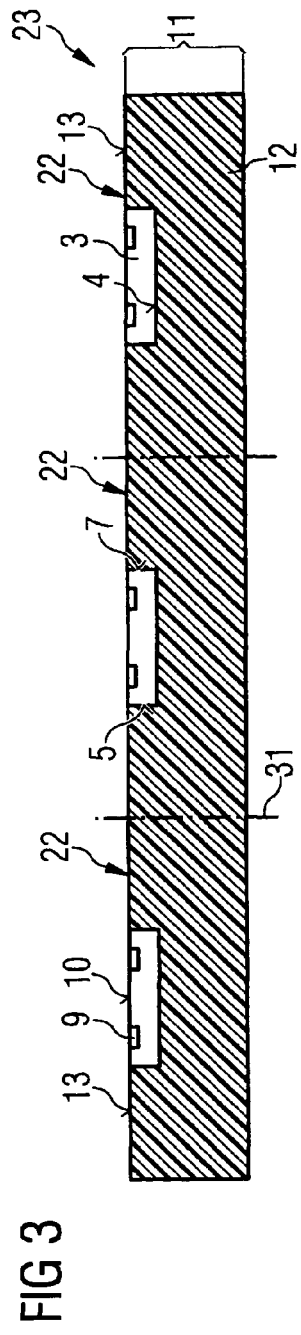
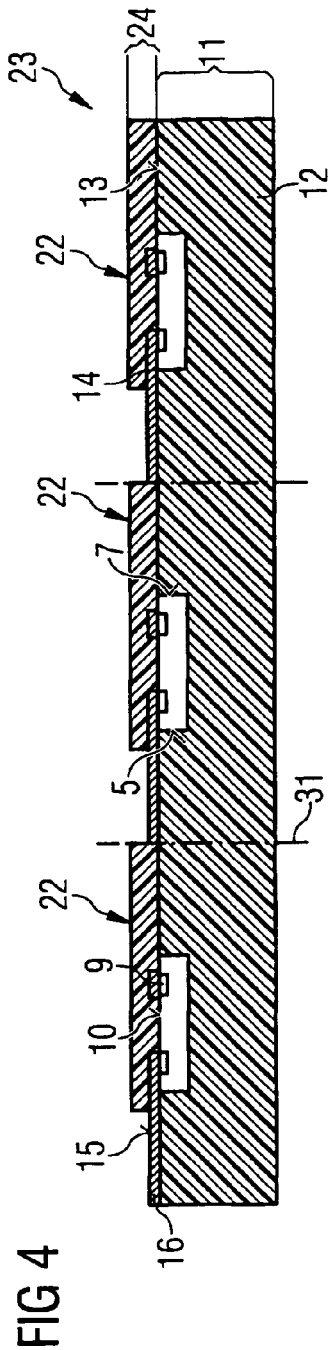
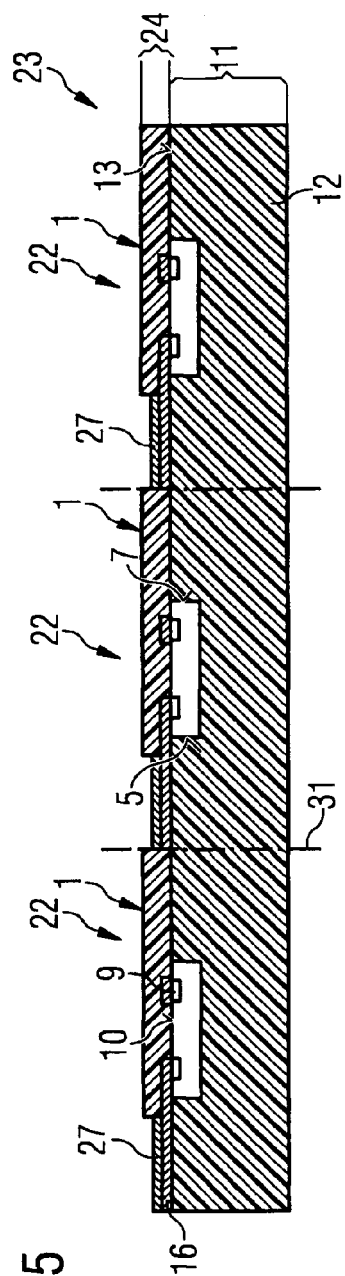
FIG 3
FIG 4
FIG 5

ELECTRONIC MODULE HAVING PLUG CONTACTS AND METHOD FOR PRODUCING IT

CROSS-REFERENCE TO RELATED APPLICATIONS

This Utility patent application claims priority to German Patent Application No. DE 103 40 129.6, filed on Aug. 28, 2003, which is incorporated herein by reference.

BACKGROUND

Electronic modules have the disadvantage that the transition between the contact areas of the semiconductor chip and external contacts, such as plug contacts of a plug-in card for memory expansion, for interface adaptation or for modem connection, is of complex configuration, thereby jeopardizing the plug-in card functions. The production of complex plug contact module constructions is cost-intensive by virtue of the subsequent introduction of a semiconductor chip into a depression of the plug-in card.

SUMMARY

The present invention provides an electronic module having plug contacts. In one embodiment, the invention provides an electronic module having plug contacts, which has a semiconductor chip embedded in a plastics composition with its rear side and its edge sides. An active top side of the semiconductor chip forms, together with the plastics composition, an overall top side, there being arranged on the latter a rewiring layer with plug contact areas and rewiring lines that connect the plug contact areas to contact areas of the top side of the semiconductor chip.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3 illustrates a diagrammatic cross section through a region of a panel for producing an electronic module.

FIG. 4 illustrates a diagrammatic cross section through a panel in accordance with FIG. 3 after application of a rewiring stratum onto an overall top side of the panel.

FIG. 5 illustrates a diagrammatic cross section through a panel in accordance with FIG. 4, prior to separation of the panel into individual electronic modules.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The invention provides an electronic module having plug contacts and a method for producing an electronic module having plug contacts. In one embodiment, the module includes a semiconductor chip having a rear side and having edge sides. An active top side of the semiconductor chip has contact areas. The semiconductor chip is packaged in a plastics composition.

Figure 1:
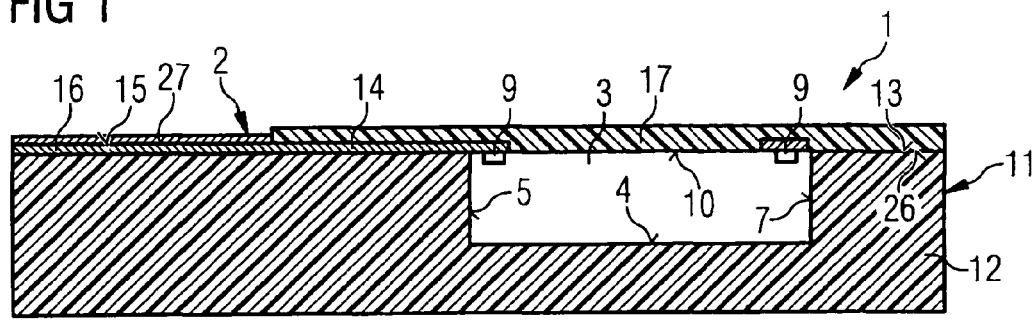
FIG. 1 illustrates a diagrammatic cross section of an electronic module of one embodiment of the invention.

FIG. 1 illustrates a diagrammatic cross section through an electronic module 1 of one embodiment of the invention. The module 1 is distinguished by an overall top side 13 formed by an active top side 10 of a semiconductor chip 3 and a top side 26 of a plastics composition 12. Plug contact areas 15 are arranged on the overall top side 13. The plug contact areas are connected to contact areas 9 on the active top side 10 of the semiconductor chip 3 via rewiring lines 14. The plug contact areas 15 are coated with a layer 27 comprising wear-resistant material such as nickel and/or a hard gold-plating for reducing the contact resistance.

A rewiring layer 16, which has the plug contact areas 15 and the rewiring lines 14, is protected by an insulating covering layer 17 in the region of the active top side 10 of the semiconductor chip 3 and in the region of the rewiring lines. The insulating covering layer 17 is made of a hard, passivating dielectric. The semiconductor chip 3 forms, with its edge sides 5 and 7 embedded into the plastics composition 12 and with its rear side 4, a plate- or card-type composition body 11. The semiconductor chip 3 itself is a memory chip having addressing logic and serves for the memory expansion of pocket computers or notebooks.

Figure 2:
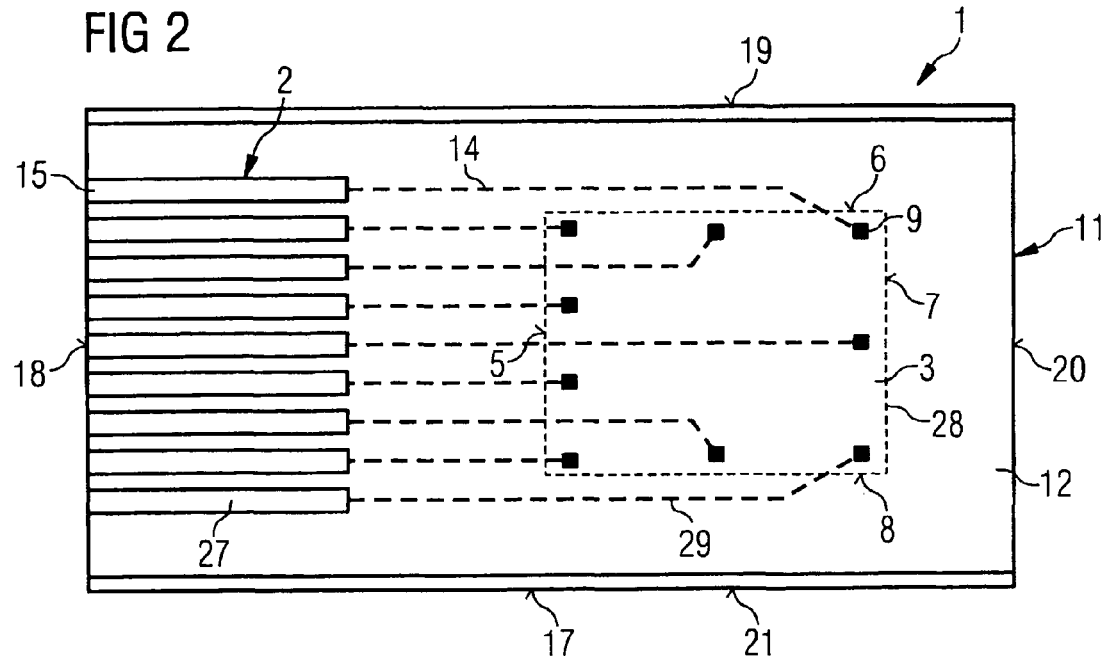
FIG. 2 illustrates a diagrammatic plan view of an electronic module in accordance with FIG. 1.

FIG. 2 illustrates a diagrammatic plan view of an electronic module 1 from FIG. 1. Components having functions identical to those in FIG. 1 are identified by the same reference symbols and are not discussed separately.

The finely dashed line 28 identifies the course of the semiconductor chip edges 5, 6, 7 and 8 within the plastics composition 12. The coarsely dashed lines 29 identify the course of the rewiring lines 14 below the covering layer 17. The plug contacts 2 are freely accessible with their wear-resistant layer 27 and are not covered by the covering layer 17. From the edge sides 18, 19, 20 and 21, the longitudinal sides 19 and 21 of the electronic module 1 are beveled, so that they form a coding that enables the electronic module 1 to be unambiguously plugged into a corresponding receiving shaft (not depicted here) of an electronic apparatus.

FIG. 3 illustrates a diagrammatic cross section through a region of a panel 23 for producing an electronic module 1. Components having functions identical to those in the previous figures are identified by the same reference symbols and are not discussed separately.

Even though FIG. 3 shows by way of example only three module positions delimited by dash-dotted lines 31, the total number of module positions 22 per module is nevertheless not limited to these three exemplary positions. However, each module position 22 is constructed identically and, in this embodiment of the invention, has a semiconductor chip 3 embedded with its rear side 4 and its edge sides 5 and 7 in a plastics composition 12, an active top side 10 of the semiconductor chip 3 forming, together with the plastics composition 12, an overall top side 13. The active top side 10 with its contact areas 9 of the semiconductor chip 3 is freely accessible on the overall top side 13 and may be coated in the subsequent method steps with a rewiring layer with rewiring layers and insulation layers of a rewiring stratum.

FIG. 4 illustrates a diagrammatic cross section through a panel 23 in accordance with FIG. 3 after application of a rewiring stratum 24 onto an overall top side 13 of the panel 23. The said rewiring stratum 24, which is applied simultaneously onto the overall top side 13 of the panel 23 for a plurality of electronic modules, has a rewiring layer 16 that is patterned in such a way as to form plug contact areas 15 and rewiring lines 14 that connect the plug contact areas 15 to the contact areas 9 of the semiconductor chip 3. The rewiring lines 14 and the contact areas 9 and also the semiconductor chip 3 are covered by a covering layer 17 associated with the rewiring stratum 24.

The application and patterning of the rewiring layer 16 in FIG. 4 were effected by vapour deposition of a closed metal layer that was subsequently patterned with the aid of a photolithography technique. The application and patterning of the covering layer 17 comprising a hard dielectric were effected in a similar manner by first of all application of a closed covering layer on the panel 23, which layer was subsequently patterned by means of photolithography technology in such a way that the plug contact areas 15 are freely accessible, while the remaining overall top side 13 with contact areas 9, semiconductor chip top side 10, and rewiring lines 14 are protected.

FIG. 5 illustrates a diagrammatic cross section through a panel 23 in accordance with FIG. 4 prior to separation of the panel 23 into electronic modules 1. Prior to the separation of the panel, a wear-resistant layer 27 was applied to the plug contact areas 15, which layer, in this first embodiment of the invention, was applied from a nickel layer as diffusion barrier and wear-resistant layer directly onto the material of the plug contact areas 15, and a gold coating made of a hard gold alloy, which reduces the contact resistance, was subsequently applied onto the nickel layer.

For singulation of the electronic modules 1 connected to one another via the composite body 11 of the panel, the panel 23 is separated into individual electronic modules 1 along the dash-dotted line 31 by means of a profile saw blade.

Figure 6:
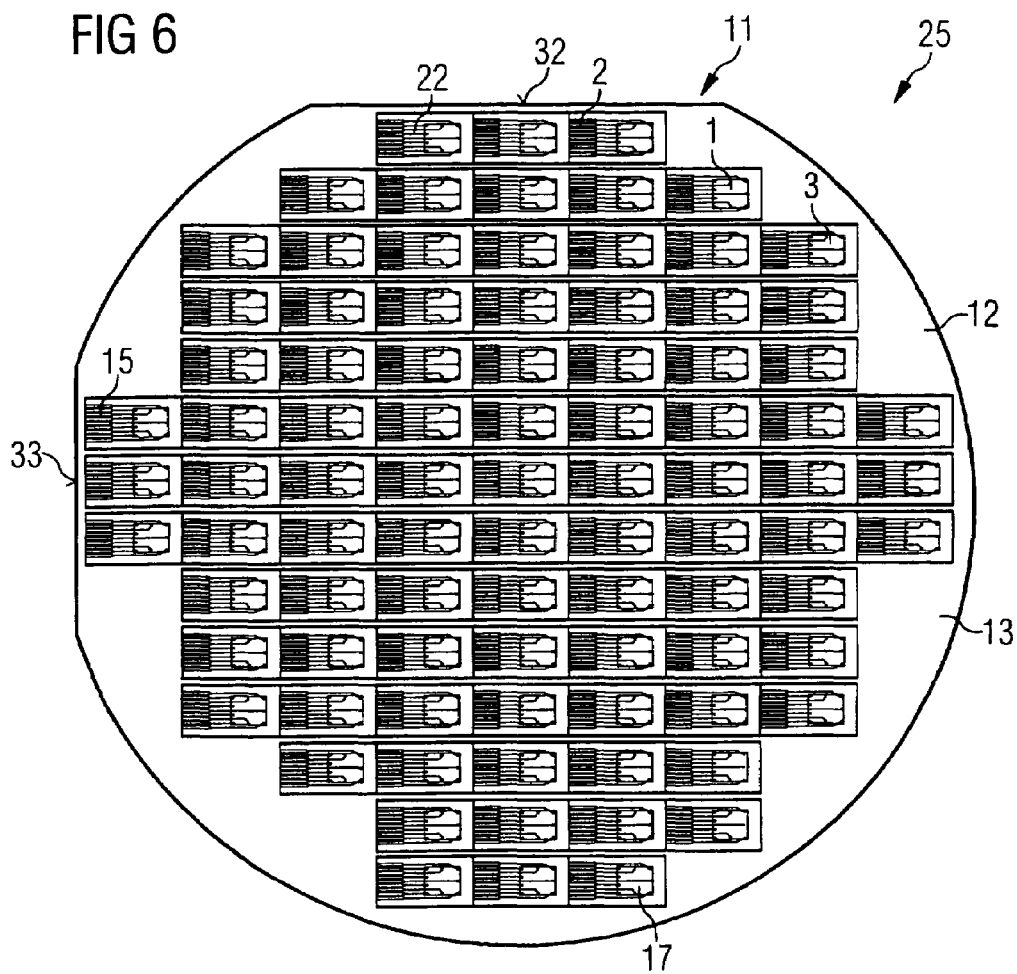
FIG. 6 illustrates a diagrammatic plan view of a wafer panel, prior to separation of the wafer panel into individual electronic modules.

FIG. 6 illustrates a diagrammatic plan view of a wafer panel 25 prior to separation of the wafer panel 25 into individual electronic modules 1. The wafer panel 25 has the form of a silicon wafer with corresponding position- and orientation-marking edge sides 32 and 33. Such a wafer panel 25 corresponds to a silicon wafer in its external dimensions and in its thickness and may consequently be processed in the same types of installations as a semiconductor wafer both in terms of phototechnology and in terms of coating technology.

In this case, the phototechnology processing relates to corresponding photolithography steps and the coating processing relates to the application of a closed metal layer for producing a rewiring layer and a further closed insulating covering layer for producing the patterned covering layer 17 for the rewiring lines and for the active top sides of the semiconductor chips 3. The reinforcement of the plug contacts of the plug contact areas 15 of the electronic modules 1 to form wear-resistant plug contacts, with the aid of further coatings, is also carried out simultaneously on the wafer panel for all the module positions 22.

Since the external contours of each module 1 are rectangular, a rectangular panel would be advantageous, but this necessitates the development of new processing installations and apparatus for coating and patterning of the panel, which increases the production costs.

During the separation of such a wafer panel 25 to form individual electronic modules 1, a coding of the edge sides of the modules is simultaneously effected by the use of profile saw blades in such a way that the electronic module 1 can be inserted into a corresponding receiving slot of an electronic apparatus (not shown here) only in a predetermined position.

Figure 7:
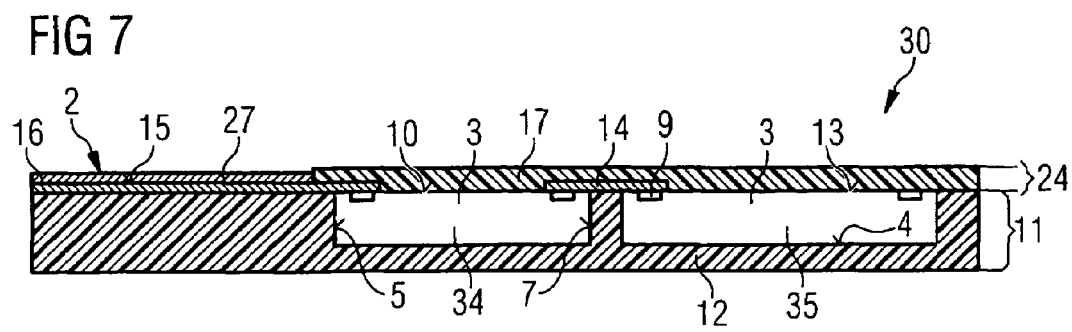
FIG. 7 illustrates a diagrammatic cross section through an electronic module of another embodiment of the invention.

FIG. 7 illustrates a diagrammatic cross section through an electronic module 30 of a second embodiment of the invention. Components having functions identical to those in the previous figures are identified by the same reference symbols and are not discussed separately.

In contrast to the embodiment in accordance with FIG. 1, the electronic module 30 of FIG. 7 is a multi-chip module having a plurality of semiconductor chips 3 embedded in the plastics composition 12 with their rear sides 4 and their edge sides 5 and 7, their active top sides 10 remaining free of the plastics composition and forming an overall top side 13 with the latter. This provides an electronic module that connects a logic chip 34 to a memory chip 35 in order to improve both the storage capacity and the access times to the memory chip 35. Besides a logic chip 34 and a memory chip 35, it is possible also to embed sensor chips in the plastics composition 12, at least the sensor region and the contact areas of the sensor chip remaining free of plastics composition and forming a part of the overall top side 13 of the electronic module 30.

The present invention reduces the production costs of electronic plug modules and at the same time to increase their reliability. Furthermore, the present invention provides a method for producing such an electronic module having plug contacts.

The invention provides an electronic module 1 having plug contacts 2 and having a semiconductor chip 3. The semiconductor chip 3 has a rear side, edge sides and contact areas on an active top side. Furthermore, the electronic module has a composite body 11 in card form, which composite body has the semiconductor chip and a plastics composition. The semiconductor chip is embedded into the plastics composition with its rear side and its edge sides. The composite body has an overall top side comprising plastics composition and top side of the semiconductor chip. Plug contacts 2 are arranged on the said overall top side of the composite body, the plug contacts 2 being connected to the contact areas of the semiconductor chip 3 within a rewiring layer 16 via rewiring lines 14 on the overall top side.

An insulating covering layer 17 is arranged on the rewiring layer 16 with the plug contacts 2 being left free. The electronic module 1 according to the invention deliberately dispenses with a complex wiring or connection between contact areas of the semiconductor chip 3 and the plug contacts 2. This increases the reliability of the electronic module 1, especially as there is no need to bridge any height differences between the active top side of the semiconductor chip 3 and the top side of the plastics composition.

Consequently, bonding connections or flip-chip connections can be completely dispensed with, which increases the reliability of the electronic module 1. Moreover, only a single moulding process is required for producing the composite body, during which process the semiconductor chip 3 is embedded into a plastics composition with its rear side and with its edge sides in such a way as to form an overall top side comprising the active top side of the semiconductor chip 3 and a top side of the plastics composition.

In order to ensure that the plug contacts 2 or the electronic module 1 having plug contacts 2 is correctly plugged into a corresponding receiving slot, the edge sides of the module 1 are coded by different profiling. This coding may be introduced during the separation of a panel 23 into individual electronic modules 1. Thus, coding grooves can additionally be introduced during the separation of a panel 23 into individual modules 1 at the edge sides of the modules 1. A further possibility consists in a different profiling of the edge sides. For this purpose, opposite edge side angles are introduced in the course of sawing, thus giving rise to separation areas that taper in pointed fashion. This is achieved by means of a corresponding profile saw blade. Accordingly, the edge sides have, in the profile, an angle not equal to 90° towards the overall top side as coding.

Since the plug contact areas 9 that arise with the rewiring lines 14 during the application of a patterned metal layer remain freely accessible after application of the covering layer, the plug contact areas 9 can be refined by coating with wear-resistant contact materials to form plug contacts 2. The rewiring layer comprising plug contact areas 9 and rewiring lines 14 may have aluminium or an aluminium alloy, copper or a copper alloy, or silver and/or a silver alloy. In order to refine the area in the region of the plug contact areas 9 to form wear-resistant plug contacts, a layer made of nickel or nickel alloy is applied, onto which a coating made of hard gold is subsequently applied in order to improve the contact transition resistance and in order to improve the wear resistance of the plug contact 2.

Another embodiment of the invention provides an intermediate product in the form of a panel 23. Such a panel has all the components of the electronic modules 1, such as semiconductor chips 3 in a composite body with overall top side comprising the active top sides of the semiconductor chips 3 and a plastics composition, plug contacts 2 on the overall top side, contact areas 9 on the semiconductor chips and rewiring lines between the contact areas 9 and the plug contacts 2 in a rewiring layer on the overall top side of the composite body. For this purpose, the overall top side of the panel has module positions arranged in rows and columns. The panel 23 can be separated into individual electronic modules by simple separation steps along the rows and columns. With the use of profile saw blades, the abovementioned coding arises in the course of the separation of the panel.

This panel 23 has the advantage that the production costs of electronic plug modules 1 in card form are reduced since the components on the panel 23 are produced and processed in parallel, simultaneously for a multiplicity of modules 1. Since the plug contacts 2 are freely accessible while the top sides of the recessed semiconductor chips 3 and the rewiring lines 14 are covered by a covering layer, the functionality of each individual module can still be established on the panel.

In one embodiment, a method for producing a panel according to the present invention is as follows. Provision is made of a semiconductor wafer with semiconductor chip positions arranged in rows and columns. The semiconductor wafer is separated into individual semiconductor chips with contact areas on an active top side of the semiconductor chip. The semiconductor chips are applied in module positions of a single-sided adhesive carrier with adhesive bonding of the active top side of the semiconductor chip onto the adhesive side of the carrier. A plastics composition is applied onto the rear sides and the edge sides of the semiconductor chips, so that the latter, apart from their active top sides, are embedded in a plastics composition. The plastics composition with the semiconductor chips cures to form a composite plate which has an overall top side comprising plastics composition and semiconductor chip top side towards the single-sided adhesive carrier. After the removal of the carrier from the composite plate, the overall top side comprising top side of the plastics composition and the top sides of the semiconductor chips is free for the further processing operations.

A patterned metal layer is applied to form plug contact areas and rewiring lines, the rewiring lines extending from the plug contact areas to the contact areas of the semiconductor chips. The rewiring lines and the contact areas of the semiconductor chips are protected by application of an insulating covering layer with the plug contact areas being left free. The uncovered plug contact areas may subsequently be coated with a wear-resistant plug contact material.

Since both the application of the rewiring layer and the application of the covering layer can be carried out simultaneously for a plurality of modules 1 on the panel, a cost-effective production method results. Since, moreover, the plug-in card arises directly in the course of applying the plastics composition onto the rear sides and edge sides of the semiconductor chips, it is no longer necessary to incorporate patterns or cutouts for receiving semiconductor chips into an existing plug-in card. Moreover, the simultaneous application of plug contact areas and rewiring lines on the overall top side of the panel means that it is not necessary to serially connect contact areas and plug contact areas, which makes the production of the modules less expensive.

In order to produce individual electronic modules 1, the panel 23 having a plurality of module positions is merely separated into individual electronic modules 1 having plug contacts 2. Such a method yields functionally stable plug modules that have already been tested at the panel level and can be produced by means of few steps, so that this method is suitable for mass production. The application of the plastics composition with the embedding of the rear sides and edge sides of the semiconductor chips may be effected by injection-moulding methods or moulding methods, the panel form produced preferably being a wafer in order to be able to carry out subsequent processes using standard equipment for "wafer processing" of semiconductor wafers.

The application of a patterned metal layer in order to form the rewiring lines and the plug contact areas may be effected by thin- or thick-film techniques, the rewiring lines being produced simultaneously with the externally accessible plug contact areas. The application of the insulating covering layer may be effected by application of a hard dielectric, which simultaneously passivates the top side of the electronic module. As an alternative, it is also possible to effect a covering comprising a plastic plate. Furthermore, provision may be made of additional screenings by corresponding metal layers or copper plates on the insulating covering.

The electronic module can be expanded as desired by further semiconductor chips and passive components that are concomitantly embedded into the plastics composition.

To summarize, this new technology affords the following advantages:

1. Reduction of the process steps, since housing and chip module are produced in one process;
2. Reduction of the various materials used and, consequently, a higher reliability and robustness due to fewer interface effects;

3. Reduction of costs by means of parallel production of the modules on a panel in a wafer form suitable for "batch processes";
4. Testability of the finished modules with panels at the wafer level;
5. Facilitation of the production of multi-chip modules;
6. The production requires no application-specific equipment, apart from the steps for rewiring processes; and
7. A single rewiring process produces both the plug contact areas and the rewiring lines to the contact areas without the need for plated-through holes and/or other techniques.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic module comprising:
   plug contacts;
   a semiconductor chip having a rear side, edge sides and having contact areas on an active top side;
   a composite body in card form, the composite body has the semiconductor chip and a single plastics composition, into which is embedded the semiconductor chip with its rear side and its edge sides, and which composite body has an overall top side comprising the plastics composition and the active top side of the semiconductor chip;
   wherein the active side of the semiconductor chip is coplanar with the top side of the plastics body;
   the plug contacts being arranged on the overall top side, the plug contacts being connected to the contact areas of the semiconductor chip via rewiring lines of a single rewiring layer on the overall top side, the rewiring lines extending between the contact areas of the semiconductor chip and the plug contacts are in contact with the contact areas of the semiconductor; and
   an insulating covering layer being arranged on the rewiring lines and on the contact areas with the plug contacts being left free;
   wherein each plug contact touches the plastics composition;
   wherein the length of each rewiring line touches the plastics composition.

2. The electronic module of claim 1, comprising longitudinal sides of edge sides of the module are coded by different profilings.

3. The electronic module of claim 2, wherein the profilings comprise different profile grooves for coding.

4. The electronic module of claim 1, comprising the longitudinal sides have, in the profile, an angle not equal to 90° towards the overall top side as coding.

5. The electronic module of claim 1, comprising that a plurality of semiconductor chips, preferably a logic chip and a memory chip, are embedded to form a multi-chip module in the plastics composition with their rear sides and their edge sides, their active top sides remaining free of the plastics composition and forming an overall top side with the latter.

6. The electronic module of claim 1, comprising the module has a screening with an insulating covering layer or a hard dielectric, or a plastic plate, or a metal layer with insulating covering layer or a copper plate with insulating covering layer.

7. A panel comprising:
   a plurality of electronic modules positioned along a top side, each electronic module comprising:
   plug contacts;
   a semiconductor chip having a rear side, edge sides and having contact areas on an active top side;
   a composite body in card form, the composite body having the semiconductor chip and a single plastics composition, into which is embedded the semiconductor chip with its rear side and its edge sides, and the composite body having an overall top side comprising the plastics composition and the active top side of the semiconductor chip;
   wherein the active side of the semiconductor chip is coplanar with the top side of the plastics body;
   wherein the plug contacts are arranged on the overall top side, the plug contacts being connected to the contact areas of the semiconductor chip via rewiring lines of a single rewiring layer on the overall top side, the rewiring lines extending between the contact areas of the semiconductor chip and the plug contacts are in contact with the contact areas of the semiconductor; and
   an insulating covering layer being arranged on the rewiring lines and on the contact areas with the plug contacts being left free;
   wherein each plug contact touches the plastics composition;
   wherein the length of each rewiring line touches the plastics composition.

8. The panel of claim 7, wherein longitudinal sides of edge sides of the electronic module are coded by different profilings.

9. The panel of claim 8, wherein the profilings comprise different profile grooves for coding.

10. The panel of claim 8, wherein the electronic module longitudinal sides have, in the profile, an angle not equal to 90° towards the overall top side as coding.

11. The panel of claim 7, comprising a plurality of semiconductor chips embedded in each electronic module to form a multi-chip module in the plastics composition, with their rear sides and their edge sides, their active top sides remaining free of the plastics composition and forming an overall top side with the latter.

12. The panel of claim 11, wherein the plurality of semiconductor chips includes a logic chip and a memory chip.

13. The panel of claim 7, wherein each electronic module has a screening with an insulating covering layer or a hard dielectric, or a plastic plate, or a metal layer with insulating covering layer or a copper plate with insulating covering layer.

14. The panel of claim 7, wherein each electronic module has at least one of a hard dielectric, a plastic plate, a metal layer or a copper plate with insulating covering layer.

15. An electronic module comprising:
   plug contacts;
   a semiconductor chip having a rear side, edge sides and having contact areas on an active top side;
   a composite body in card form, the composite body having a plastics composition, into which is embedded the semiconductor chip with its rear side and its edge sides, the composite body having an overall top side comprising the plastics composition and the active top side of the semiconductor chip;
   wherein the active side of the semiconductor chip is coplanar with the top side of the plastics body;
   the plug contacts being arranged on the overall top side, the plug contacts being connected to the contact areas of the semiconductor chip via rewiring lines of a single rewiring layer on the overall top side, the rewiring lines extending between the contact areas of the semiconductor chip and the plug contacts are in contact with the contact areas of the semiconductor; and an insulating covering layer being arranged on the rewiring lines and on the contact areas, without covering the plug contacts;

wherein each plug contact touches the plastics composition;

wherein the length of each rewiring line touches the plastics composition.

16. The electronic module of claim 15, wherein longitudinal sides of edge sides of the electronic module are coded by different profilings, wherein the profilings comprise different profile grooves for coding.

17. The electronic module of claim 16, wherein the electronic module longitudinal sides have, in the profile, an angle not equal to 90° towards the overall top side as coding.

18. The electronic module of claim 17, comprising a plurality of semiconductor chips embedded in the electronic module to form a multi-chip module in the plastics composition, with their rear sides and their edge sides, their active top sides remaining free of the plastics composition and forming an overall top side with the latter.

19. The electronic module of claim 18, wherein the plurality of semiconductor chips includes a logic chip and a memory chip.

20. The electronic module of claim 19, wherein the electronic module has a screening with an insulating covering layer, or a hard dielectric, or a plastic plate, or a metal layer with insulating covering layer or a copper plate with insulating covering layer.

21. The panel of claim 19, wherein each electronic module has at least one of a hard dielectric, a plastic plate, a metal layer or a copper plate with insulating covering layer.

* * * * *